United States Patent
Wu et al.

(10) Patent No.: US 9,601,050 B2
(45) Date of Patent: *Mar. 21, 2017

(54) EXTERNAL COMPENSATION SENSING CIRCUIT AND SENSING METHOD THEREOF, DISPLAY DEVICE

(71) Applicant: BOE TECHNOLOGY GROUP CO., LTD., Beijing (CN)

(72) Inventors: Zhongyuan Wu, Beijing (CN); Danna Song, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 317 days.

This patent is subject to a terminal disclaimer.

(21) Appl. No.: 14/342,023

(22) PCT Filed: Apr. 26, 2013

(86) PCT No.: PCT/CN2013/074820
§ 371 (c)(1),
(2) Date: Feb. 28, 2014

(87) PCT Pub. No.: WO2014/139198
PCT Pub. Date: Sep. 18, 2014

(65) Prior Publication Data
US 2016/0117980 A1    Apr. 28, 2016

(30) Foreign Application Priority Data

Mar. 14, 2013 (CN) .......................... 2013 1 0082006

(51) Int. Cl.
G09G 3/32       (2016.01)
G09G 3/3225   (2016.01)
(Continued)

(52) U.S. Cl.
CPC ......... G09G 3/3225 (2013.01); G09G 3/3233 (2013.01); H03F 3/26 (2013.01);
(Continued)

(58) Field of Classification Search
CPC .............................. G09G 3/30–3/3291; G09G 2320/04–2320/048; G09G 3/3688;
(Continued)

(56) References Cited

U.S. PATENT DOCUMENTS 5,838,113 A    11/1998  Mihara
6,078,643 A    6/2000   Vogelsong et al.
(Continued)

FOREIGN PATENT DOCUMENTS

CN    101059940 A    10/2007
CN    101552841 A    10/2009
(Continued)

OTHER PUBLICATIONS

Glen Brisebois, "Using a Differential I/O Amplifier in Single-Ended Applications," Design Note DN473, 2009, Linear Technology Corporation.*

(Continued)

*Primary Examiner* — Sanjiv D Patel
(74) *Attorney, Agent, or Firm* — Ladas & Parry LLP

(57) ABSTRACT

An external-compensation sensing circuit, sensing method, and display device. The circuit includes fully-differential operational amplifier, first capacitor, second capacitor and outputting circuit for amplifying induced current; negative input of the amplifier is connected to display screen, positive input thereof is connected to reference voltage, negative output thereof is connected to first control terminal of the outputting circuit, positive output thereof is connected to second control terminal of the outputting circuit; two terminals of the first capacitor are connected to the negative (Continued)

input of the amplifier and an input of the outputting circuit respectively; one terminal of the second capacitor is connected to the output of the outputting circuit and the other terminal is grounded. The invention enables the output voltage to respond rapidly by amplifying induced current with dual outputting stages in the sensing circuit to raise the speed of the external-compensation.

9 Claims, 2 Drawing Sheets

(51) Int. Cl.
*G09G 3/3233* (2016.01)
*H03F 3/26* (2006.01)
*H03F 3/45* (2006.01)

(52) U.S. Cl.
CPC ....... *H03F 3/45* (2013.01); *G09G 2320/0233* (2013.01); *G09G 2320/0295* (2013.01); *G09G 2320/045* (2013.01)

(58) Field of Classification Search
CPC ............... G09G 1/04; G09G 3/3685; H03F 2203/45674; H03F 3/45179; G11C 7/062; G11C 7/065; G06F 3/0413; H03K 5/2481; H03K 17/16
See application file for complete search history.

(56) References Cited

U.S. PATENT DOCUMENTS

| | | | |
|---|---|---|---|
| 6,756,962 B1 | 6/2004 | Akimoto et al. | |
| 7,876,292 B2 | 1/2011 | Cho et al. | |
| 7,973,686 B2 | 7/2011 | Nishimura | |
| 2006/0015272 A1 | 1/2006 | Giraldo et al. | |
| 2007/0182488 A1 | 8/2007 | Imayama | |
| 2008/0036708 A1 | 2/2008 | Shirasaki et al. | |
| 2009/0244056 A1 | 10/2009 | Tsuchi | |
| 2009/0289919 A1* | 11/2009 | Jung | G06F 3/0412 345/175 |
| 2010/0033458 A1 | 2/2010 | Shimizu et al. | |
| 2011/0080214 A1 | 4/2011 | Tsuchi | |
| 2011/0199366 A1* | 8/2011 | Tsuchi | G09G 3/3688 345/212 |
| 2012/0319609 A1 | 12/2012 | Choi et al. | |
| 2015/0008841 A1* | 1/2015 | Wu | G09G 3/3291 315/228 |
| 2015/0379940 A1* | 12/2015 | Kishi | G09G 3/3225 345/690 |

FOREIGN PATENT DOCUMENTS

| | | |
|---|---|---|
| CN | 101587271 A | 11/2009 |
| CN | 102064777 A | 5/2011 |
| CN | 203150074 U | 8/2013 |
| CN | 203179477 U | 9/2013 |
| JP | 3294057 B2 | 6/2002 |
| JP | 2006-323155 A | 11/2006 |
| JP | 2007-214798 A | 8/2007 |
| JP | 2007-322133 A | 12/2007 |
| JP | 2009-246741 A | 10/2009 |
| KR | 1020010105154 A | 11/2001 |
| KR | 20070055588 A | 5/2007 |
| KR | 100807504 B1 | 2/2008 |
| KR | 1008075404 B1 | 2/2008 |
| KR | 20080106228 A | 12/2008 |
| KR | 20090121040 A | 11/2009 |
| KR | 20120138876 A | 12/2012 |
| TW | 421407 U | 2/2001 |

OTHER PUBLICATIONS

International Preliminary Report on Patentability Appln. No. PCT/CN2013/074820, dated Sept. 15, 2015.
International Search Report Issued Nov. 21, 2013; Appln. No. PCT/CN2013/074820.
First Chinese Office Action Appln. No. 201310082006.3; Dated Jul. 22, 2014.
Second Chinese Office Action Appln. No. 201310082006.3; Dated Nov. 4, 2014.
International Search Report mailed Jan. 30, 2014; PCT/CN2013/079934.
First Chinese Office Action dated Oct. 10, 2014; Appln. No. 201310148727.x.
Second Chinese Office Action dated Mar. 3, 2015; Appln. No. 201310148727.x.
Korean Office Action dated May 12, 2015; Appln. No. 10-2014-7013064.
Korean Notice of Allowance dated Sep. 24, 2015; Appln. No. 10-2014-7007724.
International Preliminary Report on Patentability issued Oct. 27, 2015; PCT/CN2013/079934.
USPTO NFOA dated Nov. 10, 2015 in connection with U.S. Appl. No. 14/354,779.
Extended European Search Report dated Jul. 7, 2016; Appln. No. 13830197.3-1904/2975605 PCT/CN201374820.
USPTO NFOA dated Jun. 16, 2016 in connection with U.S. Appl. No. 14/354,779.
Extended European Search Report dated Jan. 20, 2017; Appln. No. 13848101.5-1903/2991066 PCT/CN2013079934.
Japanese Office Action dated Jan. 23, 2017; Appln. No. 2015-561898.

\* cited by examiner

EXTERNAL COMPENSATION SENSING CIRCUIT AND SENSING METHOD THEREOF, DISPLAY DEVICE

TECHNICAL FIELD OF THE DISCLOSURE

The present disclosure relates to a technical field of organic light emitting and displaying, and particularly to an external compensation sensing circuit, a sensing method thereof, and a display device.

BACKGROUND

Organic light emitting diodes (OLED) have been increasingly used as current-type light emitting devices in high-performance display devices. With increasing of display size, conventional passive matrix organic light emitting diodes require a shorter driving time for a single pixel, and thus require an increased transient current, which causes increased power consumption. Meanwhile, the usage of a large current is able to result in that voltage drop on a line of nanometer Indium Tin Oxide (ITO) is too large and that operation voltage of OLED is too high such that efficiency of OLED is decreased. However, the problems can be solved commendably by inputting OLED currents via progressive scanning of switching transistors in active-matrix organic light-emitting diodes (AMOLED).

In the design of an AMOLED backplane, a main problem to be solved is non-uniformity of brightness among pixel unit circuits.

First, for AMOLED, pixel unit circuits are constituted by thin film transistors to supply respective currents for OLED devices. In prior art, Low-temperature poly-silicon thin film transistors (LTPS TFT) or oxide thin film transistor (Oxide TFT) are mostly adopted. Compared to a general amorphous silicon thin film transistor (amorphous-Si TFT), LTPS TFT and Oxide TFT have higher mobility and more stable characteristics, and thus more suitable for applying in the AMOLED display. However, due to limitations of the crystallization process, LTPS TFTs produced on a large-area glass substrate often have non-uniformity on electrical parameters such as threshold voltage, mobility and the like, and such non-uniformity may be converted to current difference and brightness difference among OLED display devices, that is, a mura phenomena appears, and may be perceived by human eyes. Although process of Oxide TFTs has a better uniformity, similar to a-Si TFTs, a threshold voltage of the Oxide TFT may drift under a high temperature or under a case that the Oxide TFT is supplied a voltage for a long time. Due to different display pictures, the amount of the drift of threshold voltage of TFT in respective portions on a panel may be different from each other, which may cause display brightness difference, such display brightness difference often renders an image sticking phenomenon since the display brightness difference has a relation to a previously displayed image.

Second, in large-size display applications, since a power supply line on the backplane has a certain resistance and driving currents of all pixels are supplied from an ARVDD power supply, a supply voltage for an area near to a location of the ARVDD power supply in the backplane is higher than a supply voltage for an area far from the location, such phenomenon is known as a voltage drop of the power supply (IR Drop). Since the voltage of the ARVDD power supply has a relation to currents, IR drop may also cause the current difference among different areas, and thus a mura phenomenon appears during displaying. LTPS process for constructing pixel units by adopting P-type TFTs is sensitive to this problem since a storage capacitor thereof is connected between the ARVDD and a gate of TFT, and thus voltage variation of ARVDD may directly affect the voltage Vgs for driving the gate of TFTs.

Third, the non-uniformity of the electrical characteristics of OLED devices may also be caused during evaporation due to uneven film thickness. For the a-Si or Oxide TFT process constructing pixel units by adopting N-type TFTs, a storage capacitor thereof is connected between a gate of a driving TFT and an anode of OLED, if voltages of anodes of OLEDs of respective pixels are different when a data voltage is transmitted to the gate, the gate voltages Vgs applied actually to TFTs may be different, and thus display brightness difference is caused by different driving currents.

AMOLED may be divided into three categories according to the driving modes: a digital driving mode, a current driving mode and a voltage driving mode. In the digital driving mode, gray scales are achieved by using TFT as a switch to control driving time, and there is no need to compensate the non-uniformity. However, an operation frequency of the digital driving mode is multiplied with increase of the display size, which causes very high power consumption and reaches a physical limit for design in a certain range, thereby being not suitable to the large-size display applications. In the current driving mode, gray scales are achieved by directly supplying currents of different amplitudes to driving transistors, which may better compensate the non-uniformity of TFTs and IR Drop. However, when a low gray scale signal is written, a writing time may be too long since a relative big parasitic capacitor on a data line is charged by a small current. This problem is especially serious in a large-size display and difficult to be overcome. Similar to a driving method for a conventional active matrix liquid crystal display (AMLCD), in the voltage driving mode, a voltage signal representing a gray scale is supplied by a driving IC and is converted to a current signal of a driving transistor in a pixel circuit, such that OLED is driven to achieve the gray scale of brightness. The voltage driving method has advantages of fast in driving speed and easy to implement, and thus is suitable for driving a large-size panel and is widely adopted in the industry. However, as for the voltage driving method, additional TFTs and capacitors should be designed to compensate the non-uniformity of TFTs, IR Drop and the non-uniformity of OLEDs.

There are many pixel structures aiming to compensate the non-uniformity and drift of $V_{thn}$ and the non-uniformity of OLED, wherein a main design challenge for external compensation is a current sensing circuit, usually each column of pixels in a panel corresponds to a sensing circuit unit respectively in order to increase a reading speed. A main function of the sensing circuit is to convert an output or input current to a voltage signal to be transmitted to subsequent ADC module for further processing. A conventional sensing circuit is constituted by a current integrator, but it cannot make a rapid response when there is a small pixel current.

SUMMARY

The technical problem to be solved by the present disclosure is how to provide an external compensation sensing circuit, a sensing method thereof, and a display device capable of increasing an output voltage response speed of the sensing circuit and thus a speed of the external compensation.

In order to solve the above technical problem, according to one aspect of the present disclosure, there is provided an external compensation sensing circuit including a fully differential operational amplifier, a first capacitor, a second capacitor and an outputting circuit for amplifying an induced current.

A negative input terminal of the fully differential operational amplifier is connected to a display screen, a positive input terminal of the fully differential operational amplifier is connected to a reference voltage, a negative output terminal of the fully differential operational amplifier is connected to a first control terminal of the outputting circuit, and a positive output terminal of the fully differential operational amplifier is connected to a second control terminal of the outputting circuit.

Two terminals of the first capacitor are connected to the negative input terminal of the fully differential operational amplifier and an input terminal of the outputting circuit, respectively.

One terminal of the second capacitor is connected to an output terminal of the outputting circuit, and the other terminal of the second capacitor is grounded.

Optionally, a first switch is disposed between the negative input terminal of the fully differential operational amplifier and the display screen, a second switch is disposed between the two terminals of the first capacitor, and a third switch is disposed between the second capacitor and the output terminal of the outputting circuit.

Optionally, the outputting circuit includes a first outputting circuit and a second outputting circuit, wherein an output current of the second outputting circuit is M times of an output current of the first outputting circuit, where M is greater than 1 and less than 100.

Optionally, the first outputting circuit includes a first N-type MOS transistor and a first P-type MOS transistor, the gate of the first N-type MOS transistor is the first control terminal of the outputting circuit, the gate of the first P-type MOS transistor is the second control terminal of the outputting circuit, the source of the first N-type MOS transistor and the drain of the first P-type MOS transistor are connected to form the input terminal of the outputting circuit, the drain of the first N-type MOS transistor is grounded, and a source of the first P-type MOS transistor is connected to a power supply;

the second outputting circuit includes a second N-type MOS transistor and a second P-type MOS transistor, the source of the second N-type MOS transistor and the drain of the second P-type MOS transistor are connected to form the output terminal of the outputting circuit, the drain of the second N-type MOS transistor is grounded, and the source of the second P-type MOS transistor is connected to the power supply.

Optionally, a width to length ratio of the second N-type MOS transistor in the second outputting circuit is M times of a width to length ratio of the first N-type MOS transistor in the first outputting circuit, and a width to length ratio of the second P-type MOS transistor in the second outputting circuit is M times of a width to length ratio of the first P-type MOS transistor in the first outputting circuit, wherein M is greater than 1 and less than 100.

Wherein, the width to length ratio of the MOS transistor refers to a width to length ratio of a conductive channel of the MOS transistor.

According to another aspect of the present disclosure, there is provided a display device including the external compensation sensing circuit.

According to still another aspect of the present disclosure, there is provided a sensing method of the external compensation sensing circuit, the method includes steps of:

biasing the fully differential operational amplifier in a unit gain state and discharging the first capacitor (S1);

charging or discharging the first capacitor by a current of a display panel, and amplifying the charging and discharging current by M times by the outputting circuit, M being greater than 1 and less than 100 (S2);

storing a voltage in the second capacitor (S3).

With the external compensation sensing circuit, the sensing method thereof, and the display device according to embodiments of the present disclosure, a sensing current is amplified by dual outputting stages in the external compensation sensing circuit of a pixel unit circuit, such that there will be a rapid response in the output voltage and thus the speed of the external compensation will be improved.

DETAILED DESCRIPTION

Below, particular implementations of the present disclosure will be described in further detail with reference to accompanying drawings of embodiments of the present disclosure. The following embodiments are only used for illustrating the principle of the present disclosure, but not intended to limit the scope of the present disclosure.

Figure 1:
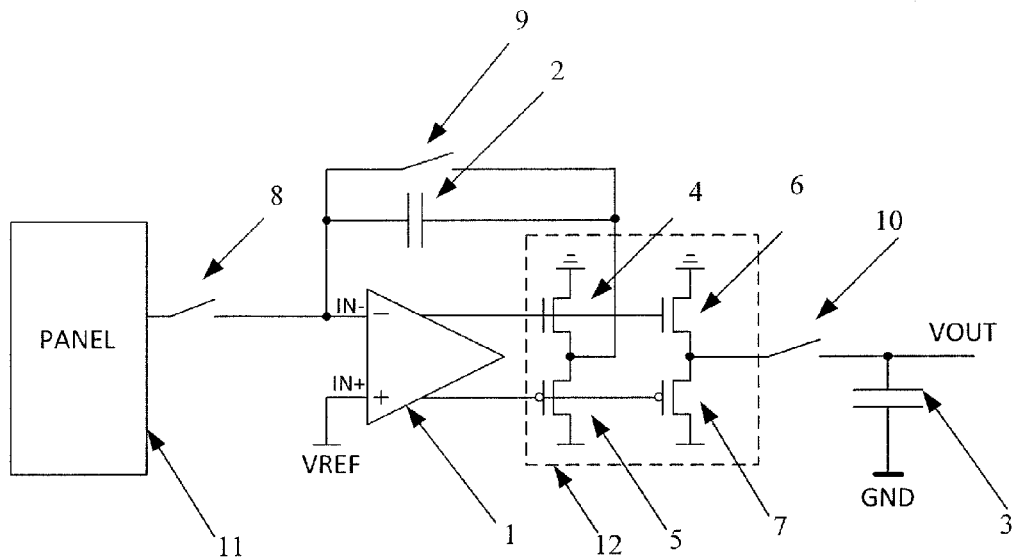
FIG. 1 is a circuit diagram of an external compensation sensing circuit according to an embodiment of the present disclosure.

An external compensation sensing circuit according to an embodiment of the present disclosure is as shown in FIG. 1, and includes a fully differential operational amplifier 1, a first capacitor 2, a second capacitor 3 and an outputting circuit 12 for amplifying a sensing current.

A negative input terminal IN− of the fully differential operational amplifier 1 is connected to a display screen 11, a positive input terminal IN+ of the fully differential operational amplifier 1 is connected to a reference voltage VREF, a negative output terminal of the fully differential operational amplifier 1 is connected to a first control terminal of the outputting circuit 12, and a positive output terminal of the fully differential operational amplifier 1 is connected to a second control terminal of the outputting circuit 12.

Two terminals of the first capacitor 2 are connected to the negative input terminal IN− of the fully differential operational amplifier 1 and an input terminal of the outputting circuit 12, respectively.

One terminal of the second capacitor 3 is connected to an output terminal of the outputting circuit 12, and the other terminal of the second capacitor 3 is grounded GND.

A first switch 8 may be disposed between the negative input terminal IN− of the fully differential operational amplifier 1 and the display screen 11. A second switch 9 may be disposed between the two terminals of the first capacitor 2. A third switch 10 may be disposed between the second capacitor 3 and the output terminal of the outputting circuit 12.

The outputting circuit 12 includes a first outputting circuit and a second outputting circuit, wherein an output current of the second outputting circuit is M times of an output current of the first outputting circuit, where M is greater than 1 and less than 100.

The first outputting circuit includes a first N-type MOS transistor 4 and a first P-type MOS transistor 5. A gate of the first N-type MOS transistor 4 is the first control terminal of the outputting circuit 12, a gate of the first P-type MOS transistor 5 is the second control terminal of the outputting circuit 12, a source of the first N-type MOS transistor 4 and a drain of the first P-type MOS transistor 5 are connected to form the input terminal of the outputting circuit 12, a drain of the first N-type MOS transistor 4 is grounded, and a source of the first P-type MOS transistor 5 is connected to a power supply;

the second outputting circuit includes a second N-type MOS transistor 6 and a second P-type MOS transistor 7, a source of the second N-type MOS transistor 6 and a drain of the second P-type MOS transistor 7 are connected to form the output terminal of the outputting circuit 12, a drain of the second N-type MOS transistor 6 is grounded, and a source of the second P-type MOS transistor 7 is connected to the power supply.

A width to length ratio of the second N-type MOS transistor 6 in the second outputting circuit is M times of a width to length ratio of the first N-type MOS transistor 4 in the first outputting circuit, and a width to length ratio of the second P-type MOS transistor 7 in the second outputting circuit is M times of a width to length ratio of the first P-type MOS transistor 5 in the first outputting circuit, where M is greater than 1 and less than 100.

A induced current is amplified by M times of its original amount by using dual outputting stages in the external compensation sensing circuit of a pixel unit circuit, where M is greater than 1 and less than 100, such that the output voltage may respond rapidly and thus raise the speed of the external compensation.

A display device according to an embodiment of the present disclosure may include the above described external compensation sensing circuit.

Figure 2:
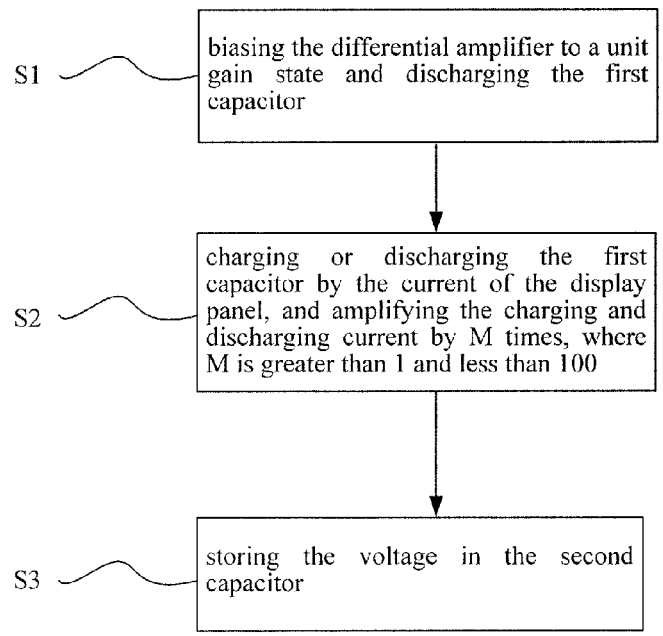
FIG. 2 is a flowchart of a sensing method of the external compensation sensing circuit according to an embodiment of the present disclosure.

A sensing method of the external compensation sensing circuit according to an embodiment of the present disclosure is as shown in FIG. 2, and an operation process of the method is described as follows.

In step S1, in the external compensation sensing circuit as shown in FIG. 1, the first switch 8 is turned off, the second switch 9 and the third switch 10 are turned on, the fully differential operational amplifier is biased in a unit gain state and the first capacitor is discharged.

In step S2, in the external compensation sensing circuit as shown in FIG. 1, the first switch 8 is turned on, the second switch 9 is turned off and the third switch 10 is turned on, the first capacitor 2 is charged or discharged by a current of a display panel, and the second outputting circuit amplifies the charging and discharging current of the first outputting circuit by M times, where M is greater than 1 and less than 100.

In step S3, in the external compensation sensing circuit as shown in FIG. 1, the third switch 10 is turned off, and a voltage is stored in the second capacitor 3.

Particularly, the method may include the following three phases.

The first phase is an initial resetting phase. During this phase, the first switch 8 is turned off, the second switch 9 and the third switch 10 are turned on, at this time, the amplifier is biased in a unit gain state and the negative input terminal IN− of the fully differential operational amplifier 1 is the same as the outputting voltage, being VREF. The two terminals of the first capacitor 2 are connected to the negative input terminal IN− of the fully differential operational amplifier 1 and the VREF voltage, respectively, such that the first capacitor 2 is discharged.

A second phase is an integrating phase. During this phase, the first switch 8 is turned on, the second switch 9 is turned off and the third switch 10 is turned on, the first capacitor 2 is charged or discharged by a pixel current inside a display panel 11, and at this time variation of charges in the first capacitor 2 is $I_{IN}t$, where $I_{IN}$ is the pixel current, t is charging or discharging time. In the first outputting circuit of the outputting circuit 12, the output current is I1 and the input current is I2, so $I1+I_{IN}=I2$. The second outputting circuit performs a mirror amplification relative to the first outputting circuit, and the current is amplified by M times, the third switch 10 is turned on at this time, the current for discharging the second capacitor 3 is $M*I_{IN}$, where M is a ratio of the width-to-length ratio of the second stage to the width-to-length ratio of the first stage. It can be known that the current for charging or discharging the second capacitor 3 is amplified by M times, and thus the output may have a rapider response than that of a conventional circuit structure.

A third phase is a holding phase. During this phase, the third switch 10 is turned off, the output voltage VOUT is stored in the second capacitor 3 and then converted by a subsequent ADC for further processing.

Figure 3:
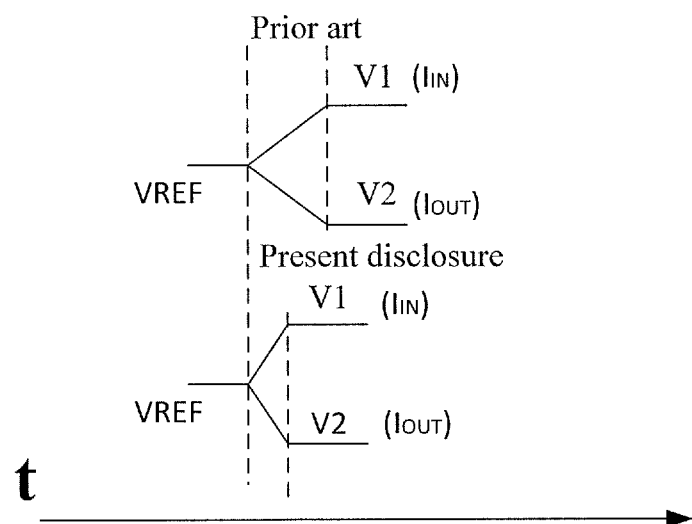
FIG. 3 is a comparison diagram of a timing of an output voltage of the external compensation sensing circuit according to an embodiment of the present disclosure.

A comparison diagram of timing of the output voltage of the external compensation sensing circuit according to the embodiment of the present disclosure is as shown in FIG. 3, wherein VREF is a reference voltage, and $V_1$ and $V_2$ are the input voltage and the output voltage, respectively. It can be clearly seen that, the speed of voltage sensing obtained by the technical solution of the embodiments of the present disclosure has a significant improvement relative to that of the prior art, particularly the raised speed is M times of its original speed, wherein M is greater than 1 and less than 100.

The above implementations of the present disclosure are only for illustrating the principle of the present disclosure, but not intended to limit the scope of the present disclosure. It will be obvious that those skilled in the art may make modifications and variations to the above embodiments without departing the spirit and scope of the present disclosure. Various equivalent technical solutions are intended to be included within the spirit and scope of the present disclosure as defined by the following claims.

What is claimed is:

1. An external compensation sensing circuit including a fully differential operational amplifier, a first capacitor, a second capacitor and an outputting circuit for amplifying an induced current;

a negative input terminal of the fully differential operational amplifier is connected to a display screen, a positive input terminal of the fully differential operational amplifier is connected to a reference voltage, a negative output terminal of the fully differential operational amplifier is connected to a first control terminal of the outputting circuit, and a positive output terminal of the fully differential operational amplifier is connected to a second control terminal of the outputting circuit;

two terminals of the first capacitor are connected to the negative input terminal of the fully differential operational amplifier and an input terminal of the outputting circuit, respectively;

one terminal of the second capacitor is connected to an output terminal of the outputting circuit, and the other terminal of the second capacitor is grounded, wherein a first switch is disposed between the negative input terminal of the fully differential operational amplifier and the display screen, a second switch is disposed between the two terminals of the first capacitor, and a third switch is disposed between the second capacitor and the output terminal of the outputting circuit, and wherein the outputting circuit includes a first outputting circuit and a second outputting circuit, and the output current of the second outputting circuit is M times of the output current of the first outputting circuit, where M is greater than 1 and less than 100.

2. The external compensation sensing circuit of claim 1, wherein the first outputting circuit includes a first N-type MOS transistor and a first P-type MOS transistor, the gate of the first N-type MOS transistor is the first control terminal of the outputting circuit, the gate of the first P-type MOS transistor is the second control terminal of the outputting circuit, the source of the first N-type MOS transistor and the drain of the first P-type MOS transistor are connected to form the input terminal of the outputting circuit, the drain of the first N-type MOS transistor is grounded, and a source of the first P-type MOS transistor is connected to a power supply;

the second outputting circuit includes a second N-type MOS transistor and a second P-type MOS transistor, the source of the second N-type MOS transistor and the drain of the second P-type MOS transistor are connected to form the output terminal of the outputting circuit, the drain of the second N-type MOS transistor is grounded, and the source of the second P-type MOS transistor is connected to the power supply.

3. The external compensation sensing circuit of claim 2, wherein a width to length ratio of the second N-type MOS transistor in the second outputting circuit is M times of a width to length ratio of the first N-type MOS transistor in the first outputting circuit, and a width to length ratio of the second P-type MOS transistor in the second outputting circuit is M times of a width to length ratio of the first P-type MOS transistor in the first outputting circuit, wherein M is greater than 1 and less than 100.

4. A display device including an external compensation sensing circuit which comprises a fully differential operational amplifier, a first capacitor, a second capacitor and an outputting circuit for amplifying an Induced current;

a negative input terminal of the fully differential operational amplifier is connected to a display screen, a positive input terminal of the fully differential operational amplifier is connected to a reference voltage, a negative output terminal of the fully differential operational amplifier is connected to a first control terminal of the outputting circuit, and a positive output terminal of the fully differential operational amplifier is connected to a second control terminal of the outputting circuit;

two terminals of the first capacitor are connected to the negative input terminal of the fully differential operational amplifier and an input terminal of the outputting circuit, respectively;

one terminal of the second capacitor is connected to an output terminal of the outputting circuit and the other terminal of the second capacitor is grounded, wherein a first switch is disposed between the negative input terminal of the fully differential operational amplifier and the display screen, a second switch is disposed between the two terminals of the first capacitor, and a third switch is disposed between the second capacitor and the output terminal of the outputting circuit, and wherein the outputting circuit includes a first outputting circuit and a second outputting circuit, and the output current of the second outputting circuit is M times of the output current of the first outputting circuit, where M is greater than 1 and less than 100.

5. The display device of claim 4, wherein the first outputting circuit includes a first N-type MOS transistor and a first P-type MOS transistor, the gate of the first N-type MOS transistor is the first control terminal of the outputting circuit, the gate of the first P-type MOS transistor is the second control terminal of the outputting circuit, the source of the first N-type MOS transistor and the drain of the first P-type MOS transistor are connected to form the input terminal of the outputting circuit, the drain of the first N-type MOS transistor is grounded, and a source of the first P-type MOS transistor is connected to a power supply;

the second outputting circuit includes a second N-type MOS transistor and a second P-type MOS transistor, the source of the second N-type MOS transistor and the drain of the second P-type MOS transistor are connected to form the output terminal of the outputting circuit, the drain of the second N-type MOS transistor is grounded, and the source of the second P-type MOS transistor is connected to the power supply.

6. The display device of claim 5, wherein a width to length ratio of the second N-type MOS transistor in the second outputting circuit is M times of a width to length ratio of the first N-type MOS transistor in the first outputting circuit, and a width to length ratio of the second P-type MOS transistor in the second outputting circuit is M times of a width to length ratio of the first P-type MOS transistor in the first outputting circuit, wherein M is greater than 1 and less than 100.

7. A sensing method of the external compensation sensing circuit of claim 1, including the steps of:

biasing the fully differential operational amplifier in a unit gain state and discharging the first capacitor (S1);

charging or discharging the first capacitor by a current of a display panel, and amplifying by an outputting circuit the charging and discharging current by M times, where M being greater than 1 and less than 100 (S2); and storing a voltage in the second capacitor (S3), wherein a first switch is disposed between the negative input terminal of the fully differential operational amplifier and the display screen, a second switch is disposed between the two terminals of the first capacitor, and a third switch is disposed between the second capacitor and the output terminal of the outputtina circuit, and wherein the outputting circuit includes a first outputting circuit and a second outputting circuit, and the output current of the second outputting circuit is M times of the output current of the first outputting circuit, where M is greater than 1 and less than 100.

8. The sensing method of claim 7, wherein the first outputting circuit includes a first N-type MOS transistor and a first P-type MOS transistor, the gate of the first N-type MOS transistor is the first control terminal of the outputting circuit, the gate of the first P-type MOS transistor is the second control terminal of the outputting circuit, the source of the first N-type MOS transistor and the drain of the first P-type MOS transistor are connected to form the input terminal of the outputting circuit, the drain of the first N-type MOS transistor is grounded, and a source of the first P-type MOS transistor is connected to a power supply;

the second outputting circuit includes a second N-type MOS transistor and a second P-type MOS transistor, the source of the second N-type MOS transistor and the drain of the second P-type MOS transistor are connected to form the output terminal of the outputting circuit, the drain of the second N-type MOS transistor is grounded, and the source of the second P-type MOS transistor is connected to the power supply.

9. The sensing method of claim 8, wherein a width to length ratio of the second N-type MOS transistor in the second outputting circuit is M times of a width to length ratio of the first N-type MOS transistor in the first outputting circuit, and a width to length ratio of the second P-type MOS transistor in the second outputting circuit is M times of a width to length ratio of the first P-type MOS transistor in the first outputting circuit, wherein M is greater than 1 and less than 100.

\* \* \* \* \*